United States Patent
Chung

(10) Patent No.: US 7,743,963 B1
(45) Date of Patent: Jun. 29, 2010

(54) SOLDERABLE LID OR COVER FOR AN ELECTRONIC CIRCUIT

(75) Inventor: Kevin Kwong-Tai Chung, Princeton, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 432 days.

(21) Appl. No.: 11/364,607

(22) Filed: Feb. 28, 2006

Related U.S. Application Data

(60) Provisional application No. 60/657,495, filed on Mar. 1, 2005.

(51) Int. Cl.
*B32B 3/06* (2006.01)

(52) U.S. Cl. .................. 228/179.1; 228/6.2; 228/180.1; 156/230; 174/50.61; 257/629; 257/704; 257/678

(58) Field of Classification Search .............. 228/179.1, 228/6.2, 180.1; 156/230; 174/50.61; 257/629, 257/704, 678
See application file for complete search history.

(56) References Cited

U.S. PATENT DOCUMENTS

| | | |
|---|---|---|
| 2,014,524 A | 9/1935 | Franz |
| 2,774,747 A | 12/1956 | Wolfson et al. |
| 3,401,126 A | 9/1968 | Miller et al. |
| 3,429,040 A | 2/1969 | Miller |
| 3,538,597 A | 11/1970 | Leinkram et al. |
| 3,788,561 A | 1/1974 | Vilagi et al. |
| 4,012,832 A | 3/1977 | Crane |
| 4,113,981 A | 9/1978 | Fujita et al. |
| 4,395,184 A | 7/1983 | Braden |
| 4,442,966 A | 4/1984 | Jourdain et al. |
| 4,519,859 A | 5/1985 | Roth et al. |
| 4,793,883 A | 12/1988 | Sheyon et al. |
| 4,844,852 A | 7/1989 | Keyser et al. |
| 5,041,396 A | 8/1991 | Valero |
| 5,046,415 A | 9/1991 | Oates |
| 5,056,296 A | 10/1991 | Ross et al. |
| 5,074,947 A | 12/1991 | Estes et al. |
| 5,112,554 A | 5/1992 | Perez et al. |
| 5,196,371 A | 3/1993 | Kulesza et al. |
| 5,201,456 A | 4/1993 | de Reynal et al. |
| 5,237,130 A | 8/1993 | Kulesza et al. |
| 5,268,048 A | 12/1993 | Leibobvitz et al. |

(Continued)

OTHER PUBLICATIONS

P. Scharf, T. Coleman and K. Avellar, "Flip Component Technology," IEEE Electronic Component Conference (1967), pp. 269-274.

(Continued)

*Primary Examiner*—Jessica L. Ward
*Assistant Examiner*—Erin B Saad
(74) *Attorney, Agent, or Firm*—Clement A. Bernard, Esq.; Dann, Dorfman, Herrell & Skillman, PC

(57) ABSTRACT

A solderable cover for solder attachment to an electronic substrate comprises a non-solderable cover defining an attachment pattern, a solderable metal layer in the shape of the attachment pattern, and a layer of adhesive bonding the solderable metal layer to the attachment pattern of the non-solderable cover, wherein the adhesive exhibits bond strength and resiliency sufficient to maintain the solderable metal layer attached to the non-solderable cover when raised in temperature to a melting temperature of a solder.

24 Claims, 2 Drawing Sheets

U.S. PATENT DOCUMENTS

| | | | |
|---|---|---|---|
| 5,272,800 | A | 12/1993 | Rooney et al. |
| 5,383,997 | A | 1/1995 | Minowa et al. |
| 5,427,642 | A | 6/1995 | Akiguchi et al. |
| 5,539,153 | A | 7/1996 | Schwiebert et al. |
| 5,572,070 | A | 11/1996 | Ross |
| 5,575,956 | A | 11/1996 | Hermansen et al. |
| 5,611,140 | A | 3/1997 | Kulesza et al. |
| 5,622,585 | A | 4/1997 | Minowa et al. |
| 5,635,672 | A | 6/1997 | Kawaura |
| 5,667,884 | A | 9/1997 | Bolger |
| 5,672,548 | A | 9/1997 | Culnane et al. |
| 5,742,007 | A | 4/1998 | Kornowski et al. |
| 5,847,929 | A | 12/1998 | Bernier et al. |
| 5,881,945 | A | 3/1999 | Edwards et al. |
| 5,931,222 | A | 8/1999 | Toy et al. |
| 5,932,875 | A | 8/1999 | Chung et al. |
| 6,046,074 | A | 4/2000 | McHerron et al. |
| 6,136,128 | A | 10/2000 | Chung |
| 6,288,905 | B1 | 9/2001 | Chung |
| 6,376,769 | B1 * | 4/2002 | Chung ........................ 174/524 |
| 6,404,643 | B1 | 6/2002 | Chung |
| 6,409,859 | B1 | 6/2002 | Chung |
| 6,421,013 | B1 | 7/2002 | Chung |
| 6,428,650 | B1 | 8/2002 | Chung |
| 6,432,253 | B1 | 8/2002 | Chung |
| 6,459,160 | B1 | 10/2002 | Goldmann et al. |
| 6,580,031 | B2 | 6/2003 | Chung |
| 6,717,819 | B1 | 4/2004 | Chung |
| 6,886,246 | B2 | 5/2005 | Chung |
| 7,154,046 | B2 | 12/2006 | Chung |

OTHER PUBLICATIONS

K. Gilleo, "Direct Chip Interconnect Using Polymer Bonding," IEEE 39th Electronic Component Conference, May 1989, pp. 37-44.

R. Lachance, H. Lavoie, A. Montanari, "Corrosion/Migration Study of Flip Chip Underfill and Ceramic Overcoating," IEEE Electronic Components And Technology Conference, (1996), pp. 885-889.

T.Y. Wu, Y. Tsukada, W. T. Chen, "Materials and Mechanics Issues in Flip-Chip Organic Packaging," IEEE Electronic Components and Technology Conference, (1996), pp. 524-534.

B. Rosner, J. Liu, Z. Lai, "Flip Chip Bonding Using Isotropically Conductive Adhesives," IEEE Electronic Components and Technology Conference, (1996), pp. 578-581.

D. Gamota, C. Melton, "Advanced Encapsulant Materials Systems for Flip Chip," Advancing Microelectronics, Jul./Aug. 1997, pp. 22-24.

R. W. Johnson, D. Price, D. Maslyk, M. Palmer, S. Wentworth, C. Ellis, "Adhesive Based Flip Chip Technology for Assembly on Polyimide Flex Substrates," IEEE International Conference on Multichip Modules, 1997, pp. 81-86.

L. Schaper, K. Maner, S. Ang, "Reliability of Large Conductive Polymer Flip Chip Assemblies for Multichip Modules (MCMs)," IEEE International conference on Multichip Modules, 1997, pp. 87-91.

Dr. V. Ozguz, R. Delos Reyes, Dr. K. Chung, Dr. J. Licari, "Flexible Conductive Adhesive Bumps for Chip Scale Packaging," The Technical Conference At Chip Scale International, May 1998, pp. 15-19.

K. Chung, V. Orguz, "Flexible Conductive Adhesive As Solder Replacement In Flip-Chip Interconnection," Proceedings Semicon West 1998, Jul. 1998, pp. 1-14.

"Cost Effective Solutions For Advanced Semiconductor Interconnection and Packaging," AI Technology, Inc., Jul. 1998, 6 Pages.

Robinson Electronics, Inc., "Molded Hybrid Covers And Lids," Product Catalog No. C/091593R, Date Unknown, 11 Pages.

EMPFASIS, "MEMS Packaging—Roadblocks to Implementation," American Competitiveness Institute, www.aciusa.org, Sep. 2001, 12 Pages.

John Maxwell, "Assembly Induced Defects," AVX Corporation, Technical Information, http://www.auxcorp.com, 8 Pages.

Tom Terlizzi, "A Proposal For The Design And Manufacture of a High Spead CPU Multichip Module For GHz Signal Processing," Aeroflex, Revised Jun. 1996, 8 Pages.

Proposal #N88-198, "Hermetic packaging Equivalent," AI Technology, Jan. 1988, pp. 1-22. (Redacted).

International Search Report, Oct. 10, 1999, 1 Page.

U.S. Appl. No. 10/170,533, Office Communication, Aug. 21, 2003, 6 Sheets.

* cited by examiner

SOLDERABLE LID OR COVER FOR AN ELECTRONIC CIRCUIT

This Application claims the benefit of U.S. Provisional Application Ser. No. 60/657,495 filed Mar. 1, 2005, entitled "Solderable Lids Made of and on Non-Solderable Substrate and Material" which is incorporated herein by reference in its entirety.

The present invention relates to a cover or lid for an electronic circuit and, in particular, to a cover or lid that can be attached using solder.

Plastic covers and lids, such as those made out of liquid crystal polymers, can provide a good seal against moisture penetration under gross-leak and fine-leak testing conditions, but plastic lids are not solderable. Similarly glass covers and lids, which are used for sealing optical components, provide a good seal, but are not solderable. Ceramic covers and lids, which are used extensively for sealing electronic packages, especially hermetically sealed packages, are attached using a specialty adhesive or a glass frit that melts at a temperature much higher than that normally expected in further processing, e.g., such as 300° C. or above. Thus, adhesives and reflowable glass frits have become the predominant processes for attaching such covers and lids to circuit packages and boards.

Even some common metals, such as aluminum, are not solderable, e.g., because they are easily oxidized, and so must be pre-treated and/or pre-tinned before soldering. Solderable metals can be plated or deposited onto covers and lids that cannot be soldered, but the process therefor can be time consuming and expensive.

Nevertheless, soldering is in many instances a preferred method for attaching a cover or a lid to an electronic substrate, e.g., because soldering is compatible with other assembly processes, and/or because soldering is self-aligning, self-leveling and self-sealing.

Accordingly, there is a need for a cover or lid that is made of a non-solderable material, but that can be soldered to a substrate.

To this end, a solderable cover for solder attachment to an electronic substrate may comprise a non-solderable cover defining an attachment pattern, a solderable metal layer in the shape of the attachment pattern, and a layer of adhesive bonding the solderable metal layer to the attachment pattern of the non-solderable cover, wherein the adhesive exhibits bond strength and resiliency sufficient to maintain the solderable metal layer attached to the non-solderable cover when raised in temperature to a melting temperature of a solder.

BRIEF DESCRIPTION OF THE DRAWING

The detailed description of the preferred embodiment(s) will be more easily and better understood when read in conjunction with the FIGURES of the Drawing which include.

Figure 1:
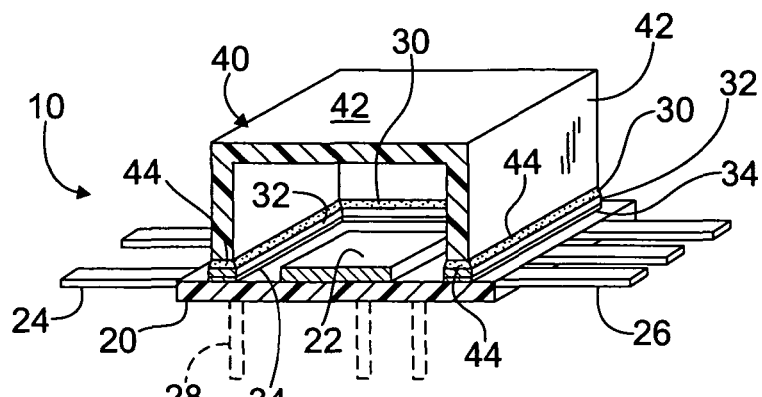
FIG. 1 is a cut-away perspective view of an example electronic device including an example cover according to the present arrangement attached using solder.

In the Drawing, where an element or feature is shown in more than one drawing figure, the same alphanumeric designation may be used to designate such element or feature in each figure, and where a closely related or modified element is shown in a figure, the same alphanumerical designation primed or designated "a" or "b" or the like may be used to designate the modified element or feature. Similarly, similar elements or features may be designated by like alphanumeric designations in different figures of the Drawing and with similar nomenclature in the specification. It is noted that, according to common practice, the various features of the drawing are not to scale, and the dimensions of the various features are arbitrarily expanded or reduced for clarity, and any value stated in any Figure is given by way of example only.

DESCRIPTION OF THE PREFERRED EMBODIMENT(S)

The new improved solderable cover or lid according to the present arrangement is directed to lids and covers that are solderable even though they are made of a base material or of a substrate material that is not solderable. Such solderable covers and lids can provide the desired sealing of a device against humidity and/or electromagnetic interference from within and without the device. Otherwise non-solderable covers and lids made of glass, ceramic, or high temperature plastics, such as liquid crystal polymers, are thereby directly solderable to an electronic substrate because of the use of adhesive layers and a thin solderable foil of metal directly bonded to these covers and lids. The terms "cover" and "lid" are used interchangeably herein, and the described arrangement may be employed for either, whether the cover or lid is planar or has walls to define a cavity.

FIG. 1 is a cut-away perspective view of an electronic device 10 including an example cover 40 according to the present arrangement attached using solder 34 on an electronic substrate 20 upon which are mounted one or more electronic components 22, such as semiconductor chips, integrated circuits, transistors, diodes, resistors, capacitors, inductors, and combinations thereof. The electronic devices 22 are connected in circuit by electrical conductors (not visible in FIG. 1) formed on or within electronic substrate 20, as is known to those having ordinary skill in the art. Electrical leads 24, 26 extending outwardly from substrate 20 as in a "flat-pack" arrangement, for example, provide conductive connections between the electrical conductors and components 22 of electronic device 10 and the apparatus to which or into which electronic device 10 is incorporated.

Because electronic components 22 commonly include very fine features that are delicate and susceptible to damaged by mechanical and electrical means, and/or are susceptible to contamination by moisture or other foreign matter, a protective lid or cover 40 is attached over and protecting electronic components 22. Protective cover 40 is attached to substrate 20 by soldering. Cover 40 is, however, of a material that is not solderable, at least at edges 44 thereof. Therefore, cover 40 includes an arrangement 30, 32, 34 so that the non-solderable cover member 42 has a solderable material 32, preferably a solderable metal layer 32, attached to edges 44 thereof.

Solder 34 is the solder that attaches cover 40 to a solderable pattern on electronic substrate 20, and solder 34 may be applied in the attaching process and/or may be pre-applied onto the lids or covers, e.g., as a solder paste or as a solder preform applied to solderable metal layer 32 or applied to the receiving solderable pattern on electronic substrate 20 in the locations where lids or covers 40 are to be attached. Preferred solders typically have a relatively low melting temperature, e.g., in the range of about 150° C. to 350° C. Examples include a tin-lead (SnPb) solder that melts at about 180° C. or a lead-free or reduced lead solder that melts at about 230° C. or higher temperature, as well as indium-based and silver-based solders.

Solderable metal layer 32 is preferably a thin foil or relatively thin sheet of a solderable metal, e.g., copper, copper alloy, brass, nickel or nickel-plated copper or aluminum, gold, silver, or of other suitable solderable metal or of a base metal that may be plated with a noble metal or other solderable metal. Metal layer 32 should be stable mechanically in addition to being solderable. Copper and alloys of similar base metals are preferred. The thickness of metal layer 32 is not critical—it may be as thin as about 0.2 mils or may be any thickness, e.g., even thicker than metal foils or sheets that can be easily formed.

In particular, cover 40 includes a solderable metal layer 34 that is joined to edges 44 of non-solderable cover member 42 by a continuous line of relatively high-temperature adhesive 30 completely around the periphery of non-solderable cover member 42. Edges 42 of cover 40 are a bonding surface that define an attachment pattern, wherein the high-temperature adhesive 30 is deposited in a pattern substantially corresponding in size and shape to that attachment pattern and the metal layer 32 is also in a pattern substantially corresponding in size and shape to that attachment pattern.

Where cover 40 is a protective cover only, it may be formed of stamped or cast or molded epoxy, liquid-crystal polymer or other suitable plastic, or of a glass or a ceramic material, or of other non-solderable material that can withstand a soldering temperature. Examples of suitable high-temperature adhesives may include a non-electrically conductive thermoplastic adhesive, such as types TP7150, TP7090, TP7750 and TP7260 or a non-electrically conductive thermosetting adhesive, such as types ME7660, ESP7670, ESP7675, and ESP7450, all of which are available from AI Technology, Inc. located in Princeton, N.J.

For example, suitable example adhesives typically exhibit a bond strength between a glass or quartz non-solderable cover member 42 and solderable metal layer 32 of more than about 5000 psi die-shear at 25° C. and of more than about 300 psi die-shear at 250° C., and exhibit a bond strength between a ceramic or liquid crystal polymer non-solderable cover member 42 and solderable metal layer 32 of more than about 4000 psi die-shear at 25° C. and of more than about 400 psi die-shear at 250° C. Such example adhesives typically exhibit a peel strength between a glass, quartz, ceramic or liquid crystal polymer non-solderable cover member 42 and solderable metal layer 32 of more than about 20 inch-pounds at 25° C. and of more than about 2 inch-pounds at 250° C. Such example adhesives typically pass fine-leak tests both before and after aging and thermal cycling per MIL-STD 883.

Suitable cover materials may include, but are not limited to, alumina and other ceramics, liquid crystal polymers, high-temperature plastics, laminates including metals, and optically-transparent materials such as borosilicate glass, quartz and sapphire.

Where cover 40 is for providing electrostatic and/or electromagnetic shielding of the electronic components it encloses, non-solderable cover member 42 may include at least a layer of a metal, such as copper, aluminum, steel, stainless steel and alloys thereof, with and without protective plating. Alternatively, non-solderable cover member 42 may be formed of a non-conductive material as above and plated with an electrically-conductive coating, such as copper, silver, gold or combinations thereof, or may be a plastic or plastic-like material that is filled with conductive particles such as copper, silver, gold, aluminum and/or carbon particles.

In the case where such electrostatic and/or electromagnetic shielding is also provided, high-temperature adhesive 30 may be an-electrically conductive thermoplastic adhesive, such as types TP8090 (filled with silver particles), TP8093 (filled with silver-plated copper particles) and TP8150 (filled with silver particles) or an electrically conductive thermosetting adhesive, such as types ESP8680 (filled with silver particles), ESP8450 (filled with silver particles) and ESP8453 (filled with silver-plated copper particles), all also available from AI Technology, Inc.

A "high temperature adhesive" is an adhesive that remains stable and retains a substantial bonding strength at the melting temperature of the solder with which the cover 40 will be attached by soldering. Preferably, high-temperature adhesive 30 is provided in the form of an adhesive preform, which may be a wet or a dried adhesive or a B-stage adhesive, and may be on a release substrate or may be in a die-cut sheet of dried or B-stage adhesive.

The adhesive layer 30 material preferably has good hermetic-like sealing properties. Preferably, the adhesive material can pass the conventional lid-sealing quality tests for gross leaks and for fine leaks at adhesive thicknesses in a ranges of, for example, about 0.5-5 mils and 3-50 mils, or wider.

In addition, the adhesive layer 30 should have the ability to withstand stresses caused by soldering temperatures and by mis-matches in the coefficient of thermal expansion (CTE) between the material of insulating lid 42, such as glasses and ceramics having a CTE in the range of about 3-15 ppm/C and plastics in the range of about 10-60 ppm/C, and typical metals including copper and solders which have a CTE in a range of about 10-30 ppm/C. Suitable adhesives may be relatively rigid, e.g., such as types ESP7670 and ME7660, so long as they have sufficient resiliency to withstand the stress caused by soldering temperatures, at least for a relatively low number of heating/cooling cycles, without de-laminating from cover 40 and metal layer 32. In addition, preferred adhesives are able to withstand a substantial number of heating/cooling cycles, perhaps thousands of cycles, over the range of temperatures to which they are expected and/or specified to be exposed in use, e.g., after soldering to an electronic substrate. Adhesives that are "molecularly flexible adhesives" have more than sufficient resiliency and flexibility to withstand many heating/cooling cycles to soldering temperatures and to operating and storage temperatures for electronic equipment.

Adhesives are considered "molecularly flexible adhesives" if they have a modulus of elasticity that is less than about 200,000 psi over the specified and/or operating temperature range of the electronic devices with which covers 40 are intended to be employed, and at the soldering temperature to which cover 40 will be subjected. "Molecularly flexible adhesives" also will elongate by at least 10% before fracturing, and many can elongate by 30% or more before fracturing. For example, types ESP8450 and ESP7450 adhesive have a modulus of elasticity between about 200,000 psi and 20,000 psi over the temperature range of about −55° C. to +150° C. Flexible adhesives may be desirable because they will flex and/or stretch with changes in temperature, as may be experienced in soldering and in an operating environment.

It is noted that covers 40 formed with the foregoing materials and employing adhesive preforms 30 of the foregoing example materials will be resistant to the passage of moisture and chemical cleaners and solvents commonly employed in the manufacture of electronic devices, such as isopropyl alcohol, volatile methylsiloxane, terpenes and other solvents. Typical adhesive 30 may exhibit volume resistivity in a range of about 100 million ohm-cm to about 0.1 ohm-cm, depending upon the adhesive material and the fillers therein, if any, and so will tend to dissipate electrostatic potential.

Surfaces of some non-polar plastic covers and/or plastic covers with contaminants to which adhesive is to be applied, e.g., edges 44 of cover 42, are preferably prepared for improved adhesion, such as by oxidizing the bond surfaces by flame, plasma or corona treatment. Covers typically range in size from about 100 mils×100 mils, i.e. about 0.1 inch by 0.1 inch, which could be employed to protect an individual transistor or diode or a small integrated circuit, to about one or two inches by one or two inches, which could be employed to protect a large integrated circuit such as a micro-processor, but could be larger or smaller, or any size between, or may be of another shape.

One example cover 40 employs an alumina ceramic non-solderable cover member 42 that is about 0.5 inch by 0.5 inch in size and about 0.15 inch high to which a 0.5 inch by 0.5 inch square rectangular preform 32 of one-ounce (about 1.5 mils thick) copper foil is attached by an about 2-mil thick 0.5 inch by 0.5 inch preform 30 of ESP7670 thermosetting adhesive. The adhesive preform 30 is cured after attaching the copper preform 32 to the bonding surface of the ceramic cover member 42, and copper preform 32 is thereby bonded to ceramic cover member 42.

Figure 2A:
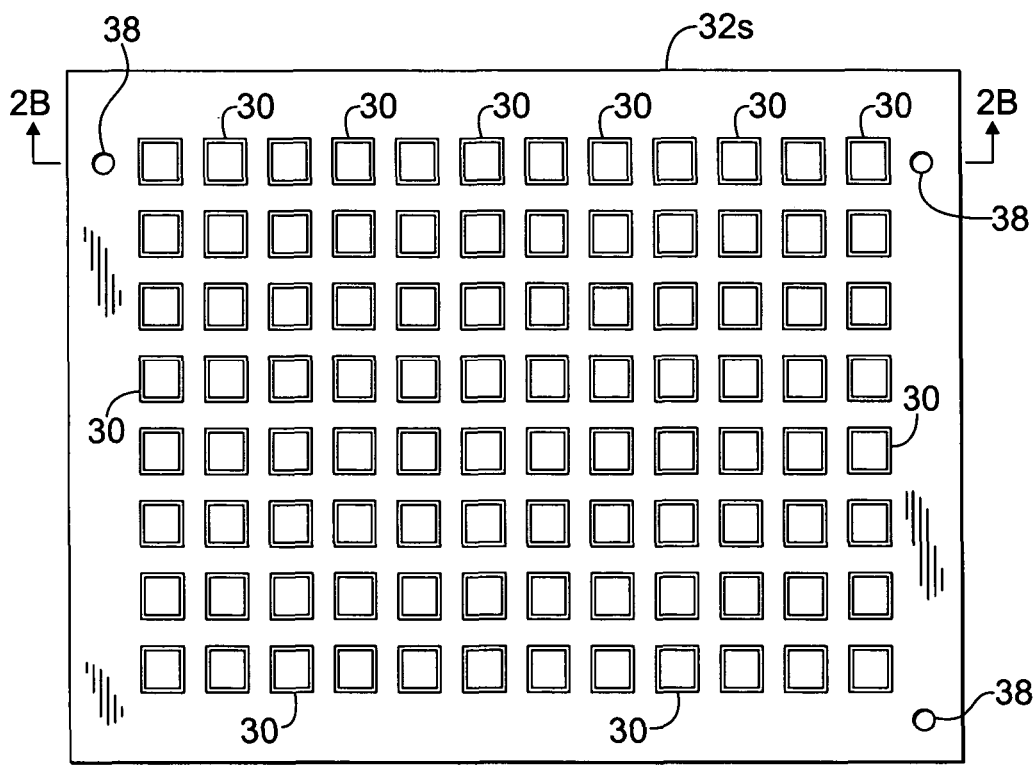
FIG. 2A is a plan view and FIG. 2B is a cross-sectional view along line I-I in FIG. 2A of a plurality of example adhesive patterns on a sheet of solderable metal.
Figure 2B:
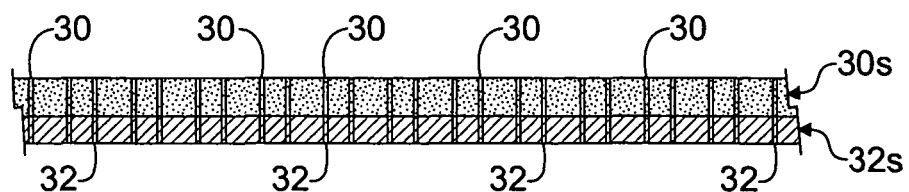

FIG. 2A is a plan view and FIG. 2B is a cross-sectional view along line I-I in FIG. 2A of a plurality of example adhesive patterns 30 on a sheet of solderable metal 32, and are helpful in understanding how example covers 40 as described may be made by any of several alternative methods described herein. For example, a metal sheet 32S, e.g., of a thin solderable metal foil, may be laminated with a sheet 30S of suitable adhesive, e.g., by heat or pressure or both, to form an adhesive-metal laminate. The laminate may then be die cut, e.g., kiss cut, to define a plurality of laminated pieces of adhesive 30 and metal 32, e.g., preforms, in the size and shape of the closed attachment pattern of the cover member 42 to which they will be attached, but still in sheet form. Such laminate structure might be as shown in FIGS. 2A-2B, for example, and cover members 42 may be attached thereto as described below.

Optionally, the laminate of metal sheet 32S and adhesive sheet 30S may have relational alignment holes 36, 38 that are relatively precisely located in relation to the die-cut patterns of adhesive 30 so that by locating the holes 36, 38 of the laminated sheets 30, 32 the positions of each die-cut laminate preform of adhesive 30 and solderable metal 32 is determined. Relational alignment holes 36, 38 facilitate positioning laminate sheets 30, 32, e.g., for placement of cover members 42 thereon, and are usually in an asymmetrical pattern, especially where the patterns of metal preform shapes 32 and adhesive preform shapes 30 are not disposed symmetrically in relation to the alignment holes 36, 38 and/or are not the same for both opposing broad surfaces of the sheets laminated so that each sheet may have a differentiated front and back.

Alternatively, a sheet 32S of solderable metal may be die cut to define patterns of solderable metal preforms 32 thereof, preferably including optional relational alignment holes 36, 38. Similarly, a sheet 30S of adhesive may be die cut to define patterns of adhesive preforms 30 thereof, preferably including optional relational alignment holes 36, 38. Then, the two sheets may be aligned, e.g., by aligning their respective relational alignment holes 36, 38, and may then be laminated together, e.g., by heat or pressure or both, to produce the example laminate structure shown in FIGS. 2A-2B to which cover members 42 may be attached.

Alternatively, the laminate patterned structure of FIGS. 2A-2B may be formed by providing a sheet of solderable metal 32S and depositing adhesive thereon, e.g., in a pattern of adhesive shapes 30 that correspond to the attachment pattern of the cover member 42 to be used therewith. Such deposition may be by any convenient method, including but not limited to screening, stenciling, mask printing, spraying, ink-jet printing, squeegee deposition, dispensing, rolling, and the like. The adhesive 30 in the desired preform size and shape may then be dried or B-staged, if desired, prior to placement of cover members 42, or cover members 42 may be placed while the adhesive 30 is still wet. Metal layer 32S may be die-cut or etched or otherwise processed to remove excess metal so that only the solderable metal preform 32 corresponding to the adhesive patterns 30 remains. Die-cutting is typically done before cover members 42 are attached to adhesive 30, and chemical or other etching is usually done after cover members 42 are attached to adhesive 30 and the adhesive is cured, but may be done before.

Figure 3:
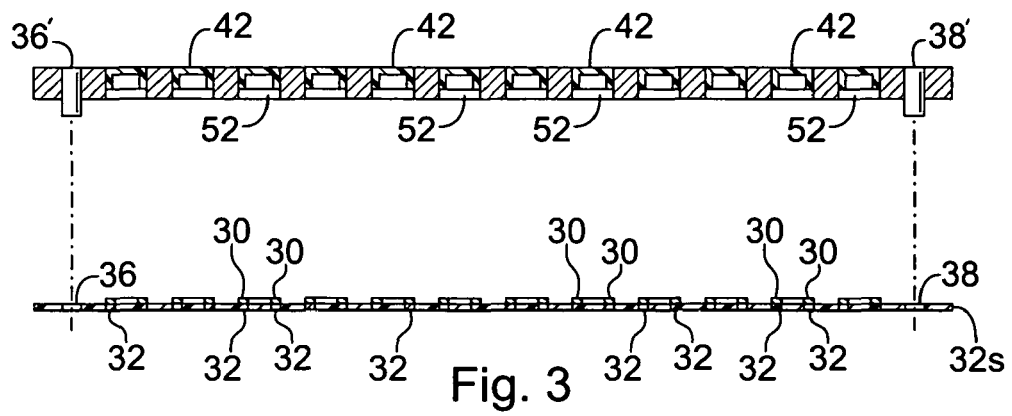
FIG. 3 is a side cross-sectional view of example adhesive patterns and solderable metal sheet of FIG. 2 taken along line I—I.
Figure 4:
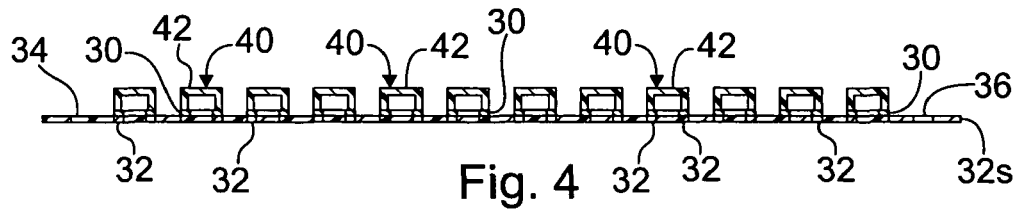
FIG. 4 is a side cross-sectional view of the example adhesive patterns and solderable metal sheet of FIG. 3 with a plurality of lids or covers thereon.

FIG. 3 is a side cross-sectional view of example adhesive patterns 30 and solderable metal sheet 32S of FIG. 2 taken along line I-I arranged for receiving cover members 42, and FIG. 4 is a side cross-sectional view of the example adhesive patterns 30 and solderable metal sheet 32S of FIG. 3 with a plurality of lid or cover members 42 thereon. The laminate sheet 32S, 30 may be made by any of the alternative methods described, however, the illustrated example has adhesive preforms remaining on sheet 32S as might be the case where the adhesive preform 30 patterns are deposited onto sheet 32S or where a die-cut laminate has had the portion of an adhesive layer 30 that is not a patterned adhesive preform 30 removed. For example, the excess adhesive not part of preforms 30 could be removed by mechanical means, such as peeling.

Each adhesive preform 30 may be relatively thin because it need only contain sufficient adhesive to form a bond between a non-solderable cover member 42 and a solderable metal foil 32 when they are pressed together in assembling a cover 40. As illustrated, metal foil 32 with the pattern of wet or dried adhesive preforms 30 thereon is ready to receive cover members 42 on the respective preforms 30.

A guide plate 50 has a pattern of receptacles 52 therein corresponding to the pattern of adhesive preforms 30 on metal foil 32. Each receptacle 52 is adapted for releasably receiving a cover member 42 therein. Preferably, guide plate 50 also has a set of relational alignment holes 36', 38' therethrough located to correspond to the set of relational alignment holes 36, 38 in metal foil 32 and in the same known relationship to the pattern of receptacles 52 as are relational alignment holes 36, 38 to the pattern of adhesive preforms 30.

Guide plate 50 is placed over metal foil 32 so that the receptacles 52 in the guide plate 50 are in direct correspondence in shape and size to the adhesive preforms 30, preferably passing an alignment pin through each of the corresponding pairs of respective relational alignment holes 36, 38 and 36', 38'. Also preferably, receptacles 52 may be several thousandths of an inch larger than the size of non-solderable cover members 42 to allow easy placement thereof. The cover members 42 are then placed directly on top of the wet adhesive preforms 30 through receptacles 52 in guide plate 50.

After cover members 42 have been placed on adhesive preforms 30 on sheet 32S, guide plate 50 is removed, producing the result shown in FIG. 4. Metal foil 32' with the cover members 42 on the adhesive preforms 30 is dried or B-staged, for example, in a belt oven or a box oven, for a time sufficient to remove solvent from the adhesive and/or for partial or complete chemical cross-linking of the adhesive to occur, whereby the wet adhesive preforms 30 become solid adhesive preforms 30, each one bonding a metal foil preform 32 to a respective one of the cover members 42, thereby providing solderable covers 40.

Covers 40 with dried adhesive preforms 30 attaching, e.g., bonding, metal foil preforms 32 thereto may then be separated, e.g., by separation along die cut lines or by chemical etching or other method, and are ready to be used, for example, in attachment onto a substrate of an electronic or other functional device. Separation of individual covers 30 may be deferred until close to a time of use of covers 40, e.g., the completed sheet 32S with cover members 42 bonded thereto may be stored or shipped without separating individual covers 40 therefrom. Separation lines may be provided by die cutting or etching of solderable metal sheet 32S, either before or after adhesive 30 is disposed thereon, or after adhesive 30 is applied and either before or after cover members 42 are attached thereto, as may be convenient.

Alternatively, separated covers 40 with adhesive and solderable metal preforms 30, 32 thereon may be packaged loose, or in tape-and-reel, waffle pack, JEDEC tray or other desired packaging as may be desired for ease of transportation and storage for later use, for example, with conventional "pick-and-place" apparatus. Covers and lids as described may be utilized in the manual, semi-automated and/or automated assembly of electronic printed circuit, boards, printed wiring boards, electronic packages, semiconductor device packages, optical device packages, sensor packages, MEMS packages, hybrid circuits, multi-chip modules, and/or other electronic equipment. Further, because the adhesives 30 employed are a set thermoplastic adhesive or a cured thermosetting adhesive, the storage life or "shelf life" of the covers and lids described is not limited by the adhesive utilized, and so is only limited by storage conditions that may allow oxidation of the exposed surface of metal layer 32, e.g. shelf life may typically be many years.

Alternatively, metal foil sheet 32S of FIGS. 3 and 4 may be employed with conventional "pick-and-place" apparatus in two different ways. Firstly, metal foil 32 with wet adhesive preforms 30 thereon as shown in the lower portion of FIG. 3 may be transferred to a pick-and-place apparatus, such as a model ECM 93 pick-and-place machine available from Manncorp located in Huntingdon Valley, Pa., which then picks up individual cover members 42 and places one on each of the adhesive preforms 30 on metal foil 32, thereby also producing the result including covers 40 shown in FIG. 4. Metal foil 32 containing the wet adhesive preforms 30 is then processed as described above, e.g., to separate individual covers 40.

Secondly, metal foil 32 with cover members 42 attached thereto by dried adhesive preforms 30 as shown in FIG. 4 may be transferred to a pick-and-place apparatus, such as the Manncorp model ECM 93, which apparatus then picks up each cover 40 with dried adhesive preform 30 and metal foil 32 attached thereto, the metal foil sheet 32S separating along die cut or etched lines, and places covers 40 in predetermined locations on the substrate of an electronic or other functional device.

In any of the foregoing ways of utilizing metal foil sheet 32S with pick-and-place apparatus, metal foil sheet 32S may be positioned on such pick-and-place apparatus by employing the optional relational alignment holes 36, 38 therein, whereby the location of each cover 40 on the pick-and-place apparatus is determined with sufficient precision for use with pick-and-place equipment.

Further, solderable metal sheet 32S need not be die-cut or otherwise prepared for separation before adhesive 30 and cover members 42 are attached thereto. After cover members 42 are bonded to sheet 32S by adhesive 30, and adhesive 30 is dried or B-staged or is cured, as desired, but usually cured if thermosetting and cooled if thermoplastic, sheet 32S may be chemically etched or otherwise patterned to remove the portions of sheet 32S that are not solderable metal preforms 32. For chemical etching, a pattern of a photoresist may be applied to the surface of sheet 32S opposite the surface onto which cover members 42 are bonded by adhesive 30, and the photoresist patterned surface may be exposed to a suitable etchant.

Where metal sheet 32S is a very thin sheet, e.g., less than about 1 mil thick, sheet 32S may be supported by a carrier structure that provides additional strength for processing. Suitable supporting carriers include, for example, release liners, release papers, metal sheets with releasable adhesive thereon, and the like. A support carrier may also be employed where metal sheet 32S needs to be handled after it has been die-cut, e.g., either before adhesive 30 is applied or laminated, or thereafter, or any or all times during the processing of solderable metal sheet 32S. Alternatively and/or additionally, an adhesive sheet 30S may provide support for metal sheet 32S.

Figure 5:
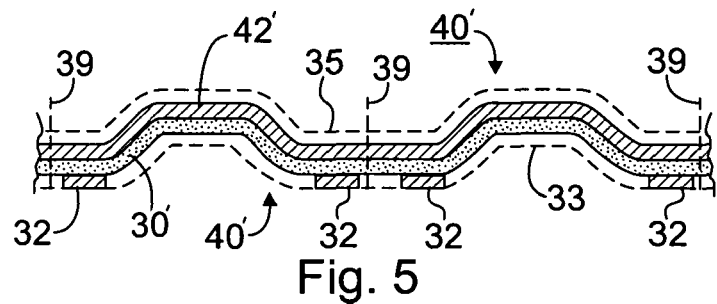
FIG. 5 is a cross-sectional view of an alternative example cover according to the present arrangement.

FIG. 5 is a cross-sectional view of an alternative example cover 40' according to the present arrangement. Cover 40' is formed of a sheet of a cover material 42, e.g., a metal or formable plastic, that is laminated to an adhesive layer 30' and is then pressed or stamped or otherwise formed so as to have domed portions defining respective covers 40'. A solderable metal layer 32 is laminated with cover layer 42' and adhesive layer 30' usually before the stamping or other forming of the laminate. Portions 33 of the solderable metal layer may be removed, e.g., by chemical etching or another process, or by mechanical means if the layer 32, 33 is or has been die cut or otherwise prepared for separation, to define solderable metal patterns 32 that can be soldered to an electronic substrate. Then the laminate structure 42', 30' 32 is separated along lines 39 into individual covers 40' by cutting, die-cutting, machining, or any other convenient means.

Optionally, where cover layer 42' is electrically conductive and it is desired that an electrically conductive surface not be exposed, an insulating layer 35 may be applied on cover layer 42'. Insulating layer 35 is usually applied to layer 42' before the stamping or other forming of the laminate structure to define domed regions for covers 40', by any convenient method, e.g., by rolling a paste, spraying a liquid or laminating a sheet 35. However, if insulating layer 35 is applied after the laminate structure is formed to define covers 40', e.g., layer 35 could be applied by spraying, laminating or other suitable method.

Where it is desired that the exterior surfaces of a cover 40, 40' should be insulating, e.g., in the case of metal lid 40', it is desirable to employ a laminate of flexible or B-staged adhesive 30', 35 that can be stamped and cut into individual lids 40'. For example, a copper foil of about ½-2 oz copper foil may be laminated with a sheet of B-staged ESP7450 or ESP7670 thermosetting adhesive from AI Technology, Inc. Type ESP7450 and similar thermosetting adhesives can be cured or B-staged and are more suitable for relatively thicker metal covers 40' because they are flexible and are not needed to provide mechanical strength which is provided by the relatively thicker metal foil layer 42'. Type ESP7670 and similar thermosetting adhesives are a more rigid material and so should be stretched and formed, e.g., by stamping, before being cured. Such adhesives may be employed with relatively thinner metal foil covers because they can provide additional mechanical strength and stability when they have been cured.

Optionally, the laminated structure illustrated in FIG. 5 may include relational alignment holes as described herein. Such relational alignment holes can be useful for positioning at least solderable metal patterns 32 in relation to the domed forming pattern for covers 40' and separation lines 39.

Various methods for applying adhesive layers 30, 30' and solderable metal layers 32 can be similar to those described in certain previous patents and patent applications by the present inventor, including, for example:

U.S. Published Patent Application No. 2004/0170825 entitled"Device Cover Having a Gapped Adhesive Preform Thereon for Covering a Device on an Electronic Substrate;"

U.S. Published Patent Application No. 2002/0150740 entitled "Cover with Gapped Adhesive Preform;"

U.S. Pat. No. 6,432,253 entitled "Cover with Adhesive Preform and Method for Applying Same;"

U.S. Pat. No. 6,428,650 entitled "Cover for an Optical Device and Method for Making Same;"

U.S. Pat. No. 6,409,859 entitled "Method of Making a Laminated Adhesive Lid, as for an Electronic Device;" and U.S. Pat. No. 6,136,128 entitled "Method of Making an Adhesive Preform Lid for Electronic Devices."

Each of the foregoing published Patent Applications and Issued Patents are hereby expressly incorporated herein by reference in its entirety.

Figure 6:
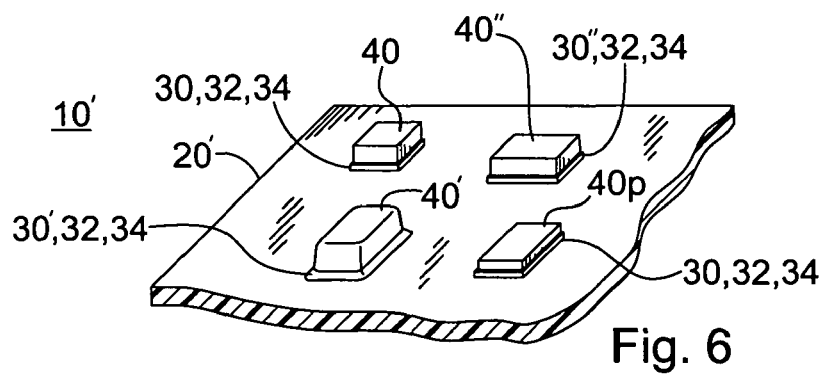
FIG. 6 is a perspective view of a portion of an example electronic device having a plurality of lids or covers according to the present arrangement attached thereon using solder.

FIG. 6 is a perspective view of a portion of an example electronic device 10' having a plurality of lids or covers 40, 40', 40", 40P according to the present arrangement attached thereon using solder 34. A plurality of non-conductive lids or covers 40, 40' and/or a plurality of electrically conductive lids or covers 40" and/or a plurality of planar lids or covers 40P may be attached to an electronic substrate 20' such as a printed circuit wiring board 20'. Each cover 40, 40', 40", 40P covers and protects one or more components (not visible) that are attached to printed wiring board 20', for example, by adhesives, soldering, wire bonding or other known arrangement. Covers 40, 40', 40", 40P are attached to printed wiring board 20' by soldering of their respective solderable metal layers 34 to corresponding (reciprocal) solderable attachment patterns on circuit board 20'. Such soldering may be by reflow soldering or by directly applied heat, e.g., a soldering iron, or by any other suitable manner.

Solder paste or flowed solder 34 may be pre-applied onto lid or cover 40, 40', 40", 40P as described. Alternatively or in addition, solder paste or flowed solder may be pre-applied onto the solderable attachment patterns on substrate 20' if desired, e.g., to allow the soldering and sealing operation to be performed efficiently. With solder paste deposited or otherwise applied onto the solderable attachment patterns on substrate 20' or on the respective metal layers 32 of solderable lids 40, 40', 40", 40P, solderable lids 40, 40', 40", 40P can thereafter placed on the attachment patterns of circuit board 20' and be retained thereon by the solder paste for reflow or other soldering.

Solder-sealing of covers 40, 40', 40", 40P usually provides an advantage over adhesive sealing in that solders are self-leveling, self-aligning and self-sealing once they are heated up to the solder reflow temperature. Thus, the only requirement is to place the lid or cover 40, 40', 40", 40P in the desired position on an electronic substrate, and the covers 40, 40', 40", 40P will self-align and the solder will form a hermetic seal once the soldering temperature is achieved. Because the adhesive 30, 30', 30" is preferably selected to have hermetic-like sealing properties and is present as a relatively thin layer that is usually relatively wide as compared to its thickness, it also can provide a relatively good seal. In addition, the methods for making covers 40, 40', 40", 40P allow for the adhesive 30, 30', 30" to be applied in a controlled manner so that its thickness may be well controlled and relatively uniform, thereby to facilitate the desired thin layer for providing a relatively hermetic-like seal between cover member 42, 42' and solderable metal foil 32.

Certain glass or ceramic substrates 42, e.g., substrates 42P that are flat or planar, may be metallized with solderable metals so as to provide lids that can be directly soldered. The glass or ceramic substrate 42 may be seeded with metal, e.g., by applying a "sol-gel" of metal particles and an organic carrier and then firing to remove the organic carrier material. Seeding with metal may also be provided by electroless seeding or by electrolytic seeding. The seeding may be in a pattern that corresponds to the desired pattern of solderable metal. The seeded substrate may then have a solderable metal plated up on the seeded portions thereof to provide the solderable layer 32 by which the lid may be soldered to an electronic substrate. Suitable solderable metals for seeding and for plating include copper, gold, silver, and other solderable metals, and plating may be by electroless plating, by electrolytic plating, or by any other suitable method to build up a metal layer 32.

A solderable cover for attachment to an electronic substrate by solder may comprise a non-solderable cover member defining an attachment pattern, wherein the non-solderable cover member is of a material that is not solderable; a solderable metal layer in the shape of the attachment pattern; and a layer of adhesive bonding the solderable metal layer to the attachment pattern of the non-solderable cover member, wherein the adhesive exhibits bond strength and resiliency sufficient to maintain the solderable metal layer attached to the non-solderable cover member when raised in temperature to a melting temperature of a solder. The non-solderable cover member may include an optically transparent cover, an electrically insulating cover, an electrically conductive cover, a planar cover, a domed cover, a cover having a base and a wall defining a cavity, or any combination thereof. The attachment pattern of the non-solderable cover member may be planar, and may be defined by a continuous edge or by plural contiguous edges; or may be in the shape of a rectangle, a square, a polygon, a circle, or any combination thereof; or may be defined by a continuous edge or by plural contiguous edges and is in the shape of a rectangle, a square, a polygon, a circle, or any combination thereof. The material of the non-solderable cover member that is not solderable may include formed epoxy, stamped epoxy, cast epoxy, molded epoxy, liquid-crystal polymer, plastic, glass, borosilicate glass, quartz, sapphire, alumina, ceramic, laminated metal and insulating layers, or any combination thereof. The solderable metal layer may include copper, copper alloy, brass, nickel, nickel-plated copper, nickel-plated aluminum, gold, silver, a base metal plated with a noble metal, a base metal plated with a solderable metal, or any combination thereof. The non-solderable cover member may include an optically transparent cover, an electrically insulating cover, an electrically conductive cover, a laminated cover, a formed laminated cover, or any combination thereof. The adhesive may comprise a molecularly flexible adhesive. The solderable cover may further comprise a layer of solder or solder paste on an exposed surface of the solderable metal layer, and may be combined with an electronic substrate having a solderable attachment pattern thereon corresponding to the attachment pattern of the non-solderable cover member, wherein the layer of solder or solder paste may be reflowed to solder the solderable metal layer of the solderable cover to the solderable attachment pattern of the electronic substrate.

A solderable cover for attachment to an electronic substrate by solder may comprise a non-solderable cover member having a base and one or more walls defining a cavity therein, wherein edges of the one or more walls distal the base define a planar attachment pattern, and wherein the non-solderable cover member is of a material that is not solderable; a solderable metal layer in the shape of the planar attachment pattern and attached to the edges of the one or more walls of the non-solderable cover member; and a layer of adhesive bonding the solderable metal layer to the planar attachment pattern of the non-solderable cover member, wherein the adhesive exhibits bond strength and resiliency sufficient to maintain the solderable metal layer attached to the non-solderable cover member when raised in temperature to a melting temperature of a solder. The non-solderable cover member may be electrically insulating, electrically conductive, domed, optically transparent, or any combination thereof. The planar attachment pattern of the non-solderable cover member may be planar, and may be defined by a continuous edge or by plural contiguous edges; or may be in the shape of a rectangle, a square, a polygon, a circle, or any combination thereof; or may be defined by a continuous edge or by plural contiguous edges and may be in the shape of a rectangle, a square, a polygon, a circle, or any combination thereof. The material of the non-solderable cover member that is not solderable may include formed epoxy, stamped epoxy, cast epoxy, molded epoxy, liquid-crystal polymer, plastic, glass, borosilicate glass, quartz, sapphire, alumina, ceramic, laminated metal and insulating layers, or any combination thereof. The solderable metal layer may include copper, copper alloy, brass, nickel, nickel-plated copper, nickel-plated aluminum, gold, silver, a base metal plated with a noble metal, a base metal plated with a solderable metal, or any combination thereof. The adhesive may comprise a molecularly flexible adhesive. The solderable cover may further comprise a layer of solder or solder paste on an exposed surface of the solderable metal layer, and may be combined with an electronic substrate having a solderable attachment pattern thereon corresponding to the attachment pattern of the non-solderable cover member, wherein the solder paste or the solder may be reflowed to solder the solderable metal layer of the solderable cover to the solderable attachment pattern of the electronic substrate.

A solderable cover for attachment to an electronic substrate by solder may comprise a non-solderable planar cover member having an edge or edges defining a periphery, wherein the periphery defines a planar attachment pattern, and wherein the non-solderable planar cover member is of a material that is not solderable; a solderable metal layer in the shape of the planar attachment pattern and attached proximate the periphery of the non-solderable planar cover member; and a layer of adhesive bonding the solderable metal layer to the planar attachment pattern of the non-solderable planar cover member, wherein the adhesive exhibits bond strength and resiliency sufficient to maintain the solderable metal layer attached to the non-solderable planar cover member when raised in temperature to a melting temperature of a solder. The non-solderable planar cover member may be electrically insulating, electrically conductive, domed, optically transparent, or any combination thereof. The material of the non-solderable planar cover member that is not solderable may include formed epoxy, stamped epoxy, cast epoxy, molded epoxy, liquid-crystal polymer, plastic, glass, borosilicate glass, quartz, sapphire, alumina, ceramic, laminated metal and insulating layers, or any combination thereof. The solderable metal layer may include copper, copper alloy, brass, nickel, nickel-plated copper, nickel-plated aluminum, gold, silver, a base metal plated with a noble metal, a base metal plated with a solderable metal, or any combination thereof. The adhesive may comprise a molecularly flexible adhesive. The solderable cover may further comprise a layer of solder or solder paste on an exposed surface of the solderable metal layer, and may be combined with an electronic substrate having a solderable planar attachment pattern thereon corresponding to the planar attachment pattern of the non-solderable planar cover member, wherein the solder paste or the solder may be reflowed to solder the solderable metal layer of the solderable cover to the solderable planar attachment pattern of the electronic substrate.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such. For example, as can be seen in FIGS. 1, 4, 5 and 6, the size and shape of adhesive layer 30 and of solderable metal layer 32 may differ from the size and shape of the attachment pattern of cover member 42.

While the present invention has been described in terms of the foregoing example embodiments, variations within the scope and spirit of the present invention as defined by the claims following will be apparent to those skilled in the art. For example, where a cover or lid 40P is planar, as might be the case for a glass or transparent plastic optical lid, or for a cover or lid 40P for an electronic substrate 20, 20' that is a ceramic or other electronic package, the described adhesive and metal foil patterns 30, 30', 30", 32 may be attached to both of the broad surfaces of the planar cover or lid 40P. Thus, in attaching such cover or lid 40P, the orientation thereof would be immaterial because its "front" and "back" surfaces both have a solderable metal pattern 32 bonded thereto by an adhesive 30, 30'.

While a continuous solder seal is hermetic and does not allow moisture or other materials of the outside environment to pass into the inside of the package 10, 10' where it may have a possibly damaging effect, cover or lid 40, 40', 40" may have gaps in adhesive layer 30, 30', 30", in metal layer 32, and/or in solder 34 in a case wherein it is not desirable to have a continuous seal, such as may be the case when only EMI shielding is desired and hermeticity is not required or desired.

Finally, numerical values stated are typical or example values, and are not limiting values. Values in any particular instance may be substantially larger or smaller or both.

What is claimed is:

1. A solderable cover for attachment to an electronic substrate by solder, said solderable cover comprising:
    a non-solderable cover member having a surface defining a substantially continuous attachment pattern, wherein said non-solderable cover member is of a material that is not solderable;
    a solderable metal layer that is continuous and of substantially the same size and substantially the same shape as the continuous attachment pattern; and a layer of adhesive bonding said solderable metal layer to the continuous attachment pattern of said non-solderable cover member, wherein said solderable metal layer remains bonded to said non-solderable cover member by said layer of adhesive when raised in temperature to a melting temperature of a solder, whereby said non-solderable cover member with said solderable metal layer bonded thereto by said layer of adhesive provides said solderable cover.

2. The solderable cover of claim 1 wherein said non-solderable cover member includes an optically transparent cover, an electrically insulating cover, an electrically conductive cover, a planar cover, a domed cover, a cover having a base and a wall defining a cavity, or any combination thereof.

3. The solderable cover of claim 1 wherein the attachment pattern of said non-solderable cover member is planar and:
- is defined by a continuous edge or by plural contiguous edges; or
- is in the shape of a rectangle, a square, a polygon, a circle, or any combination thereof; or
- is defined by a continuous edge or by plural contiguous edges and is in the shape of a rectangle, a square, a polygon, a circle, or any combination thereof.

4. The solderable cover of claim 1 wherein the material of said non-solderable cover member that is not solderable includes formed epoxy, stamped epoxy, cast epoxy, molded epoxy, liquid-crystal polymer, plastic, glass, borosilicate glass, quartz, sapphire, alumina, ceramic, laminated metal and insulating layers, or any combination thereof.

5. The solderable cover of claim 1 wherein said solderable metal layer includes copper, copper alloy, brass, nickel, nickel-plated copper, nickel-plated aluminum, gold, silver, a base metal plated with a noble metal, a base metal plated with a solderable metal, or any combination thereof.

6. The solderable cover of claim 1 wherein said non-solderable cover member includes an optically transparent cover, an electrically insulating cover, an electrically conductive cover, a laminated cover, a formed laminated cover, or any combination thereof.

7. The solderable cover of claim 1 wherein said adhesive comprises a molecularly flexible adhesive.

8. The solderable cover of claim 1 further comprising a layer of solder or solder paste on an exposed surface of said solderable metal layer.

9. The solderable cover of claim 8 in combination with an electronic substrate having a solderable attachment pattern thereon corresponding to the attachment pattern of said non-solderable cover member, wherein said layer of solder or solder paste is reflowed to solder said solderable metal layer of said solderable cover to the solderable attachment pattern of said electronic substrate.

10. A solderable cover for attachment to an electronic substrate by solder, said solderable cover comprising:
- a non-solderable cover member having a base and one or more walls defining a cavity therein, wherein edges of the one or more walls distal the base define a planar continuous attachment pattern, and wherein said non-solderable cover member is of a material that is not solderable;
- a solderable metal layer that is continuous and of substantially the same size and substantially the same shape as the planar continuous attachment pattern and attached to the edges of the one or more walls of said non-solderable cover member; and
- a layer of adhesive bonding said solderable metal layer to the planar continuous attachment pattern of said non-solderable cover member, wherein said solderable metal layer remains bonded to said non-solderable cover member by said layer of adhesive when raised in temperature to a melting temperature of a solder, whereby said non-solderable cover member with said solderable metal layer bonded thereto by said layer of adhesive provides said solderable cover.

11. The solderable cover of claim 10 wherein said non-solderable cover member is electrically insulating, electrically conductive, domed, optically transparent, or any combination thereof.

12. The solderable cover of claim 10 wherein the planar attachment pattern of said non-solderable cover member is planar and:
- is defined by a continuous edge or by plural contiguous edges; or
- is in the shape of a rectangle, a square, a polygon, a circle, or any combination thereof; or
- is defined by a continuous edge or by plural contiguous edges and is in the shape of a rectangle, a square, a polygon, a circle, or any combination thereof.

13. The solderable cover of claim 10 wherein the material of said non-solderable cover member that is not solderable includes formed epoxy, stamped epoxy, cast epoxy, molded epoxy, liquid-crystal polymer, plastic, glass, borosilicate glass, quartz, sapphire, alumina, ceramic, laminated metal and insulating layers, or any combination thereof.

14. The solderable cover of claim 10 wherein said solderable metal layer includes copper, copper alloy, brass, nickel, nickel-plated copper, nickel-plated aluminum, gold, silver, a base metal plated with a noble metal, a base metal plated with a solderable metal, or any combination thereof.

15. The solderable cover of claim 10 wherein said adhesive comprises a molecularly flexible adhesive.

16. The solderable cover of claim 10 further comprising a layer of solder or solder paste on an exposed surface of said solderable metal layer.

17. The solderable cover of claim 16 in combination with an electronic substrate having a solderable attachment pattern thereon corresponding to the attachment pattern of said non-solderable cover member, wherein said solder paste or said solder is reflowed to solder said solderable metal layer of said solderable cover to the solderable attachment pattern of said electronic substrate.

18. A solderable cover for attachment to an electronic substrate by solder, said solderable cover comprising:
- a non-solderable planar cover member having an edge or edges defining a periphery, wherein the periphery defines a continuous planar attachment pattern, and wherein said non-solderable planar cover member is of a material that is not solderable;
- a solderable metal layer that is continuous and of substantially the same size and substantially the same shape as the continuous planar attachment pattern and attached proximate the periphery of said non-solderable planar cover member; and
- a layer of adhesive bonding said solderable metal layer to the continuous planar attachment pattern of said non-solderable planar cover member, wherein said solderable metal layer remains bonded to said non-solderable planar cover member by said layer of adhesive when raised in temperature to a melting temperature of a solder, wherein said non-solderable cover member with said solderable metal layer bonded thereto by said layer of adhesive provides said solderable cover.

19. The solderable cover of claim 18 wherein said non-solderable planar cover member is electrically insulating, electrically conductive, domed, optically transparent, or any combination thereof.

20. The solderable cover of claim 18 wherein the material of said non-solderable planar cover member that is not solderable includes formed epoxy, stamped epoxy, cast epoxy, molded epoxy, liquid-crystal polymer, plastic, glass, borosilicate glass, quartz, sapphire, alumina, ceramic, laminated metal and insulating layers, or any combination thereof.

21. The solderable cover of claim 18 wherein said solderable metal layer includes copper, copper alloy, brass, nickel, nickel-plated copper, nickel-plated aluminum, gold, silver, a base metal plated with a noble metal, a base metal plated with a solderable metal, or any combination thereof.

22. The solderable cover of claim 18 wherein said adhesive comprises a molecularly flexible adhesive.

23. The solderable cover of claim 18 further comprising a layer of solder or solder paste on an exposed surface of said solderable metal layer.

24. The solderable cover of claim 23 in combination with an electronic substrate having a solderable planar attachment pattern thereon corresponding to the planar attachment pattern of said non-solderable planar cover member, wherein said solder paste or said solder is reflowed to solder said solderable metal layer of said solderable cover to the solderable planar attachment pattern of said electronic substrate.

* * * * *